United States Patent [19]

Kobatake

[11] Patent Number: 4,749,880

[45] Date of Patent: Jun. 7, 1988

[54] CIRCUIT FOR DETECTING LEVEL OF INPUT VOLTAGE

[75] Inventor: Hiroyuki Kobatake, Tokyo, Japan

[73] Assignee: NEC Corporation, Tokyo, Japan

[21] Appl. No.: 764,919

[22] Filed: Aug. 12, 1985

[30] Foreign Application Priority Data

Aug. 10, 1984 [JP] Japan ................. 59-167480

[51] Int. Cl.$^4$ ........................ H03K 5/153; H03K 5/24
[52] U.S. Cl. ........................ 307/362; 307/350; 307/355
[58] Field of Search ............... 307/355, 356, 362, 363, 307/350; 330/257, 288

[56] References Cited

U.S. PATENT DOCUMENTS

4,464,591  8/1984  Rapp ..................... 307/362
4,573,177  2/1986  Petrosky ................. 307/296 R Primary Examiner—John Zazworsky
Attorney, Agent, or Firm—Sughrue, Mion, Zinn, Macpeak and Seas

[57] ABSTRACT

A circuit for detecting the level of an input voltage is disclosed, in which the input voltage is converted into a current and this current is compared with a reference current obtained by converting a reference voltage. To accomplish such circuit functions, this level detection circuit comprises means for converting the input voltage into a first current, means for converting the reference voltage into a second current, means for producing a third current relative to the first current, means for producing a fourth current relative to the second current, and means for combining the third and fourth current. A detection output terminal is coupled to the combining means.

5 Claims, 3 Drawing Sheets

CIRCUIT FOR DETECTING LEVEL OF INPUT VOLTAGE

BACKGROUND OF THE INVENTION

The present invention relates to a circuit for detecting a level of an input voltage, and particularly to a level detection circuit composed of insulated gate field effect transistors.

A level detection circuit employing a ratio circuit and an inverter circuit has been proposed to detect the level of an input voltage, particularly to detect that the input voltage is larger in absolute value than a power supply voltage. The ratio circuit includes first and second insulated gate field effect transistors (IGFET's) connected in series between power supply terminals. The first IGFET is of an enhancement type and supplied with the input voltage, and the second IGFET is of a depletion type. The connection point of the first and second IGFET's is an output terminal of the ratio circuit to which the inverter circuit is connected.

The output level of the ratio circuit is changed in accordance with the ratio of the internal impedances of the first and second IGFET's and the internal impedance of the first IGFET is controlled by the input voltage. When the output level of the ratio circuit exceeds the threshold level of the inverter circuit, the inverter circuit changes its output logic level.

Thus, the detection level of the input voltage is determined by the internal impedances of the first and second IGFET's and the threshold level of the inverter circuit. Accordingly, various detection levels of the input voltage can be designed with facility, and thus it is possible to generate the detection output when the input voltage exceeds the power supply voltage.

However, precise control of the threshold level of the inverter circuit is very difficult. Moreover, the internal impedances of the IGFET's depend on the threshold levels thereof, and it is also quite difficult to precisely determine the threshold levels of the IGFET's. As a result, the detection level of the input voltage deviates considerably from a designed value.

SUMMARY OF THE INVENTION

Therefore, an object of the present invention is to provide an improved detection circuit for detecting the level of an input voltage.

Another object of the present invention is to provide a level detection circuit in which effect on the detection level of an input voltage upon deviation or variation of threshold levels of IGFET's is minimized.

A level detection circuit according to the present invention comprises an input terminal supplied with an input voltage, a reference terminal supplied with a reference voltage, first means coupled to the input terminal for converting the input voltage into a first current, second means coupled to the reference terminal for converting the reference voltage into a second current, third means coupled to the first means for producing a third current relative to the first current, fourth means coupled to the second means for producing a fourth current relative to the second current, fifth means coupled to the third and fourth means for combining the third and fourth currents, and an output terminal coupled to the fifth means.

In the case where the input voltage is smaller in absolute value than the reference voltage, the first current is smaller than the second current. Assuming that the ratio of the third current to the first current and that of the fourth current to the second current are 1, respectively, the third current is also smaller than the fourth current. The output terminal thereby takes a first logic level. When the input voltage becomes larger in absolute value than the reference voltage, the first current becomes larger than the second current. The third current thereby takes a value larger than the fourth current. As a result, the output terminal is inverted from the first logic level to a second logic level.

Thus, the circuit according to the present invention detects the level of the input voltage by comparing the currents relative to the input voltage and the reference voltage. Such a current comparison circuit is stabilized against the deviation of and the change is threshold levels of IGFET's and the changes in power supply voltage. The detection level of the input voltage is controlled by the current conversion ratio between the first and second means and/or the current producing ratio between the third and fourth means. Accordingly, the various detection levels can be designed with facility without deviation from the designed value.

It is convenient to constitute the third and fourth means with a current mirror circuit. The current miror circuit is composed of two IGFET's and produces an output current proportional to an input current, and the ratio of the output current to the input current is determined by the ratio of conductances between those IGFET's. Each of the first and second means may be composed of an IGFET having a gate supplied with the input voltage or the reference voltage.

BRIEF DESCRIPTION OF THE DRAWINGS

The above and other objects, advantages and features of the present invention will be more apparent from the following description taken in conjunction with the accompanying drawings, in which.

DESCRIPTION OF THE PRIOR ART

Figure 1:
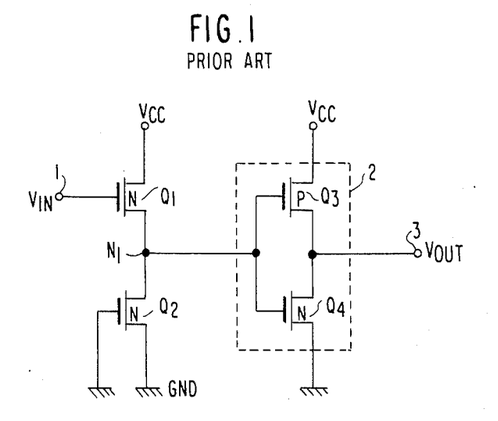
FIG. 1 is a circuit diagram showing a level detection circuit according to prior art.

A level detection circuit according to prior art is shown in FIG. 1 to facilitate the understanding of the present invention. This circuit is composed of an enhancement MOS (Metal-Oxide-Semiconductor) transistor $Q_1$ of an N-channel type, a depletion MOS transistor $Q_2$ of the N-channel type, and an inverter 2. The transistors $Q_1$ and $Q_2$ are connected in series between power supply terminals $V_{cc}$ and GND. The gate of the transistor $Q_1$ is connected to an input terminal 1 supplied with an input voltage $V_{IN}$ to be detected, and the gate of the transistor $Q_2$ is grounded. The inverter 2 is composed of a P-channel MOS transistor $Q_3$ and an N-channel MOS transistor $Q_4$ connected in series between the power supply terminals $V_{cc}$ and GND. The gates of the transistors $Q_3$ and $Q_4$ are connected in common to the node $N_1$, and an output terminal 3 is connected to the connection point of the transistors $Q_3$ and $Q_4$.

In the case where the input voltage $V_{IN}$ is at a low level, i.e., at a ground level, the transistor $Q_1$ is in a nonconductive state. On the other hand, the transistor $Q_2$ is of the depletion type, and hence the node $N_1$ takes the ground level. As a result, the transistor $Q_3$ is turned ON and the output voltage $V_{OUT}$ takes a high level, i.e., a power supply voltage $V_{cc}$.

When the input voltage $V_{IN}$ rises to the threshold level of the transistor $Q_1$, the transistor $Q_1$ is brought into a conductive state. The potential at the node $N_1$ is thus determined by the ratio of the internal impedance of the transistor $Q_1$ to that of the transistor $Q_2$. The internal impedance of the transistor $Q_1$ is considerably high at the time when the input voltage $V_{IN}$ rises to the threshold level of the transistor $Q_1$, and therefore the potential at the node $N_1$ is substantially equal to the ground level. The output voltage $V_{OUT}$ at the terminal 3 is thereby maintained at the high level.

The internal impedance of the transistor $Q_1$ is lowered by the increase in level of the input voltage $V_{IN}$, and the potential at the node $N_1$ is increased in response thereto. Accordingly, when the input voltage $V_{IN}$ increases to such a level that the potential at the node $N_1$ exceeds the threshold level of the inverter 2, the transistor $Q_4$ is turned ON to invert the output voltage $V_{OUT}$ to the low level.

Thus, the detection level of the input voltage $V_{IN}$ at which the output voltage $V_{OUT}$ changes from the high level to the low level, is determined by the internal impedance of the transistors $Q_1$ and $Q_2$ and the threshold level of the inverter 2. Accordingly, various detection levels of the input voltage $V_{IN}$ can be designed by adjusting these parameters.

In some IC's (integrated circuit devices), there is further provided a test circuit for testing an operation of an internal signal processing circuit. In this case, the test circuit should not be activated in a normal operation state of the IC, and further one of the external lead terminals supplied with signals to be processed by the internal signal processing circuit is used in common as a terminal supplied with a testing voltage for activating the test circuit. The signal to be processed has a level amplitude changing between the power voltage $V_{CC}$ and the ground voltage GND. The testing voltage is therefore selected to take a level larger than the power voltage $V_{CC}$, whereby the testing voltage is distinguished from the signal to be processed. Accordingly, such a circuit is required, that produces an output signal in response only to the application of the testing voltage.

Figure 2:
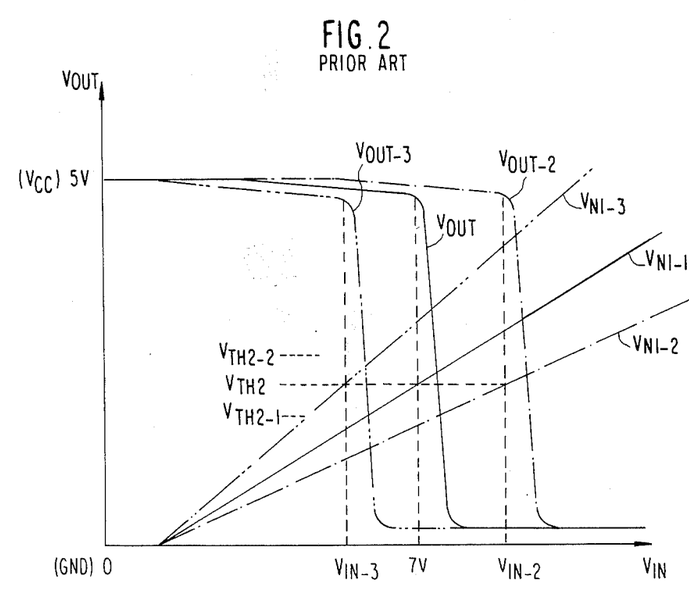
FIG. 2 is a graph representing a waveform of an output voltage $V_{OUT}$ with respect to an input voltage $V_{IN}$ in the circuit shown in FIG. 1.

The circuit shown in FIG. 1 can be utilized for detecting the testing voltage. More specifically, the internal impedances of the transistors $Q_1$ and $Q_2$ are selected such that the potential $V_{N1}$ at the node $N_1$ exceeds the threshold level $V_{TH2}$ of the inverter 2 when the input voltage $V_{IN}$ is equal to or larger than 7 V, as shown in FIG. 2. The power supply voltage $V_{CC}$ is 5 V. In normal operation, the voltage at the input terminal 1 does not become larger than the power supply voltage $V_{CC}$, and therefore the output voltage $V_{OUT}$ is maintained at a high level, as is apparent from FIG. 2. On the other hand, the testing voltage for activating the internal test circuit has a level twice as large as the power supply voltage $V_{CC}$, 10 V. Accordingly, in response to the application of the testing voltage to the terminal 1, the potential $V_{N1}$ at the node $N_1$ exceeds the threshold level $V_{TH2}$ of the inverter 2 to invert the output voltage $V_{OUT}$ from the high level to the low level. The output terminal 3 is coupled to the internal test circuit, so that the test circuit is activated to test the operation of the internal signal processing circuit.

However, it is very difficult to precisely control the internal impedances of the transistors $Q_1$ and $Q_2$. Particularly, the transistor $Q_1$ is of an enhancement type and the transistor $Q_2$ is a depletion type, and therefore the deviation from the designed impedance of the transistor $Q_1$ occurs independently of the deviation from the designed impedance of the transistor $Q_2$. As a result, the rate of change in the potential $V_{N1}$ at the node $N_1$ is unavoidably deviated from the designed rate $V_{N1-1}$, and is represented by $V_{N1-2}$ or $V_{N1-3}$ in FIG. 2. The level of the input voltage $V_{IN}$ at which the output voltage $V_{OUT}$ changes to the low level is thereby shifted to the level $V_{N1-2}$ or $V_{N1-3}$, as shown in FIG. 2. If the level $V_{N1-2}$ is larger than 10 V, the testing voltage is not detected. In some case where the level $V_{N1-3}$ is smaller than the power voltage $V_{CC}$, a low level output voltage $V_{OUT}$ is produced even when the IC attains the normal operation.

The threshold level $V_{TH2}$ of the inverter 2 is also deviated from the designed value, as represented by $V_{TH2-1}$ or $V_{TH2-2}$ in FIG. 2, resulting in change in level of the input voltage $V_{IN}$ at which the output voltage $V_{OUT}$ is inverted to the low level.

As described above, the detection level of the prior art circuit is not stabilized against the deviations from the designed impedances of the transistors $Q_1$ and $Q_2$ from the designed threshold level of the inverter 2.

DETAILED DESCRIPTION OF THE PREFERRED EMBODIMENTS

Figure 3:
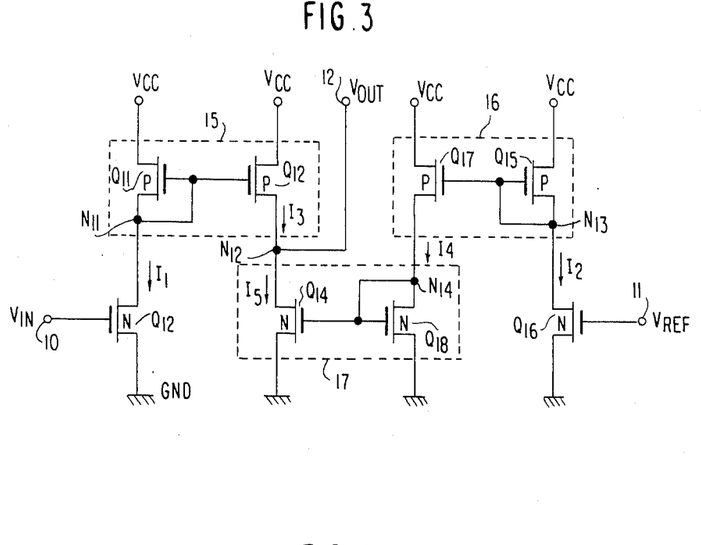
FIG. 3 is a circuit diagram representing an embodiment of the present invention.

Referring to FIG. 3, there is shown a level detection circuit according to an embodiment of the present invention. This circuit is composed of complementary MOS transistors. An input voltage $V_{IN}$ to be detected is supplied to a first input terminal 10 which is in turn connected to the gate of an N-channel MOS transistor $Q_{12}$. The transistor $Q_{12}$ is connected between a ground terminal and a first node $N_{11}$, and thus converts the input voltage $V_{IN}$ into a first current $I_1$ relative to the level of the input voltage $V_{IN}$. A second input terminal 11 receives a reference voltage $V_{REF}$ and is connected to the gate of an N-channel MOS transistor $Q_{16}$ connected between the ground terminal and a third node $N_{13}$. The reference voltage $V_{REF}$ is converted into a second current $I_2$ by the transistor $Q_{16}$.

The first current $I_1$ is supplied as an input current to a first current mirror circuit 15 composed of two P-channel MOS transistors $Q_{11}$ and $Q_{13}$. The transistor $Q_{11}$ is connected between the node $N_{11}$ and a power voltage supply terminal $V_{CC}$, and the gate thereof is connected to the node $N_{11}$ and further connected to the gate of the transistor $Q_{13}$. The transistor $Q_{13}$ is connected between the power terminal $V_{CC}$ and a second node $N_{12}$. Thus, the gates and sources of the transistors $Q_{11}$ and $Q_{13}$ are connected in common, respectively, and the gate of the transistor $Q_{11}$ is connected to its drain. Therefore, the first current mirror circuit 15 produces a third current $I_3$ proportional to the first current $I_1$. Assuming that the conductances of the transistors $Q_{11}$ and $Q_{13}$ are $G_{m11}$ and $G_{m13}$, respectively, the third current $I_3$ is as follows:

$$I_3 = I_1 \times (G_{m13}/G_{m11}) \qquad (1)$$

The second current $I_2$ is supplied to a second current mirror circuit 16 composed of two P-channel MOS transistors $Q_{15}$ and $Q_{17}$. The transistors $Q_{15}$ is connected between the power terminal $V_{CC}$ and the third node $N_{13}$, and the gate thereof is connected to the node $N_{13}$. The gate of the transistor $Q_{15}$ is further connected to the gate of the transistor $Q_{17}$ connected between the power terminal $V_{CC}$ and a fourth node $N_{14}$. The second current mirror circuit 16 thus produces a fourth current $I_4$ proportional to the second current $I_2$. When the conductances of the transistors $Q_{15}$ and $Q_{17}$ are $G_{m15}$ and $G_{m17}$, respectively, the fourth current $I_4$ takes the following value:

$$I_4 = I_2 \times (G_{m17}/G_{m15}) \qquad (2)$$

The fourth current $I_4$ is supplied as input current to a third current mirror circuit 17, which is composed of two N-channel MOS transistors $Q_{18}$ and $Q_{14}$. The transistor $Q_{18}$ is connected between the fourth node $N_{14}$ and the ground terminal. The gate of the transistor $Q_{18}$ is connected to the node $N_{14}$ and further connected to the gate of the transistor $Q_{14}$ which is in turn connected between the second node $N_{12}$ and the ground terminal. Assuming that the conductances of the transistors $Q_{14}$ and $Q_{18}$ are $G_{m14}$ and $G_{m18}$, respectively, the third current mirror circuit 17 responds to the fourth current $I_4$ and produces a fifth current $I_5$ taking the following value:

$$I_5 = I_4 \times (G_{m14}/G_{m18}) \qquad (3)$$

The second node $N_{12}$ is further connected to an output terminal 12 from which a detection output $V_{OUT}$ is derived. All the transistors $Q_{11}$ to $Q_{18}$ are of an enhancement type.

In operation, the transistor $Q_{16}$ responds to the reference voltage $V_{REF}$ and produces the second current $I_2$ relative to the level of $V_{REF}$. Assuming that $G_{m15} = G_{m17}$ and that $G_{m18} = G_{m14}$, the fourth and fifth currents $I_4$ and $I_5$ become equal to the second current $I_2$, as apparent from the equations (2) and (3). In other words, the same current as the second current $I_2$ flows into the transistors $Q_{15}$, $Q_{17}$ and $Q_{18}$, respectively, and the transistor $Q_{14}$ is biased so as to draw the current equal to the second current $I_2$ from the node $N_{12}$. As a result, the characteristic of the drain current $I_{DN}$ to the drain-source voltage $V_{DS}$ of the transistor $Q_{14}$ is represented by a line 100 in FIG. 4.

Figure 4:
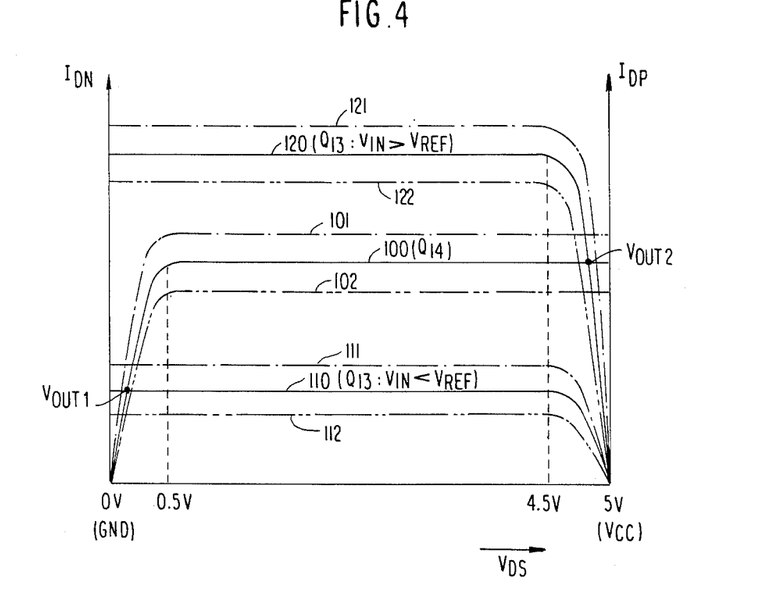
FIG. 4 is a graph for explaining an operation of the circuit shown in FIG. 3.

On the other hand, the input voltage $V_{IN}$ is converted into the first current $I_1$ by the transistor $Q_{12}$. Assuming that the conductances of the transistors $Q_{12}$ and $Q_{16}$ are equal to each other, the first current $I_1$ becomes smaller than the second current $I_2$ when the input voltage $V_{IN}$ is smaller than the reference voltage $V_{REF}$. If the conductance of the transistor $Q_{11}$ is equal to that of the transistor $Q_{13}$ ($G_{m11} = G_{m13}$), the third current $I_3$ becomes equal to the first current $I_1$. To the contrary, the transistor $Q_{14}$ has the ability to draw the current equal to the second current $I_2$. Accordingly, the characteristic of the drain current $I_{DP}$ to the drain-source voltage $V_{DS}$ of the transistor $Q_{13}$ is shown by a line 110 in FIG. 4. As apparent from FIG. 4, the line 110 intersects with the line 100 in the unsaturated region of the transistor $Q_{14}$. As a result, the voltage level $V_{OUT1}$ at the intersection of the lines 100 and 110 is produced as the output voltage $V_{OUT}$. The level of $V_{OUT1}$ is substantially the low level, i.e., the ground level as shown in FIG. 4. In other words, since the transistors $Q_{13}$ has only the ability to supply the current smaller than the second current $I_2$ which the transistor $Q_{14}$ can draw, the drain-source voltage of the transistor $Q_{14}$ is lowered, so that the output voltage $V_{OUT}$ takes the $V_{OUT1}$ level.

In accordance with the increase in level of the input voltage $V_{IN}$, the current $I_1$ (i.e., $I_3$) is increased, so that the intersection of the lines 100 and 110 changes along the line 100. However, so long as the input voltage $V_{IN}$ is smaller than the reference voltage $V_{REF}$, the intersection of the lines 100 and 110 exists in the unsaturated region of the transistor $Q_{14}$. Accordingly, the output voltage $V_{OUT}$ changes only from 0 V to 0.5 V. These levels are regarded as the low level.

When the input voltage $V_{IN}$ becomes equal to the reference voltage $V_{REF}$, the currents flowing through all the transistors $Q_{11}$ to $Q_{18}$ are equal to one another. Accordingly, the lines 100 and 110 overlap with each other in their straight portions. As a result, the output voltage $V_{OUT}$ takes an intermediate level between the power voltage $V_{CC}$ and the ground voltage GND.

When the input voltage $V_{IN}$ becomes larger even slightly than the reference voltage $V_{REF}$, the first current $I_1$ takes a value larger than the second current $I_2$. The current supply ability of the transistor $Q_{13}$ is thereby made larger than the current draw ability of the transistor $Q_{14}$. Accordingly, the characteristic of the drain current $I_{DP}$ to the drain-source voltage $V_{DS}$ of the transistor $Q_{13}$ is changed from the line 110 to a line 120 as shown in FIG. 3. In other words, the intersection of the lines 100 and 120 exists in the unsaturated region of the transistor $Q_{13}$. As a result, the output voltage $V_{OUT}$ takes a second level $V_{OUT2}$ which is near substantially to the power supply voltage $V_{CC}$. The difference between the second level $V_{OUT2}$ and the power voltage $V_{CC}$ is only 0.5 V in a maximum value as shown in FIG. 4, and it is decreased by the increase of the input voltage $V_{IN}$. Therefore, the second level $V_{OUT2}$ is regarded as the high level.

As described above, assuming that $G_{m11} = G_{m13}$, $G_{m12} = G_{m16}$, $G_{m14} = G_{m18}$, and $G_{m15} = G_{m17}$, the output voltage $V_{OUT}$ changes the low level to the high level, when the input voltage $V_{IN}$ exceeds the reference voltage $V_{REF}$. The ratio in conductances of two transistors in pair, $Q_{11}$ and $Q_{13}$, $Q_{12}$ and $Q_{16}$, $Q_{14}$ and $Q_{18}$, and $Q_{15}$ and $Q_{17}$, is controlled by the geometrical dimensions of the respective transistors.

The respective conductances of the transistors $Q_{11}$ to $Q_{18}$ may be changed by the deviation from the designed threshold levels of the transistors $Q_{11}$ to $Q_{18}$. However, two transistors in pair, $Q_{11}$ and $Q_{13}$, $Q_{12}$ and $Q_{16}$, $Q_{14}$ and $Q_{18}$, and $Q_{15}$ and $Q_{17}$, are of the same channel type, and both of the transistors in pair are of an enhancement type. Accordingly, if the threshold level of one of the transistors in pair is deviated from the designed value, the threshold level of the other transistor is also deviated from the designed value by the same value. The ratio in conductances of two transistors in pair is thereby maintained constantly. As a result, if the line 100 is shifted to a line 101 or 102, the line 110 is shifted to a line 111 or 112, respectively, by the same value. The line 120 is also shifted to a line 121 or 122, respectively. In other words, the ratio of the current conversion rate of the input voltage $V_{IN}$ by the transistor $Q_{12}$ to that of the reference voltage $V_{REF}$ by the transistor $Q_{16}$ is stabilized, and the ratios between the currents $I_1$ and $I_3$, between the currents $I_2$ and $I_4$, and between the currents $I_4$ and $I_5$ are also stabilized.

Moreover, the detection level of the input voltage $V_{IN}$ can be changed in an arbitrary manner by adjusting the ratio in conductances of the transistors in pair. For example, by selecting the ratio in conductances such that $G_{m12} < G_{m16}$, $G_{m11} > G_{m13}$, $G_{m14} > G_{m18}$, or $G_{m17} > G_{m15}$, the detection level of the input voltage $V_{IN}$ becomes larger than the reference voltage $V_{REF}$.

Figure 5:
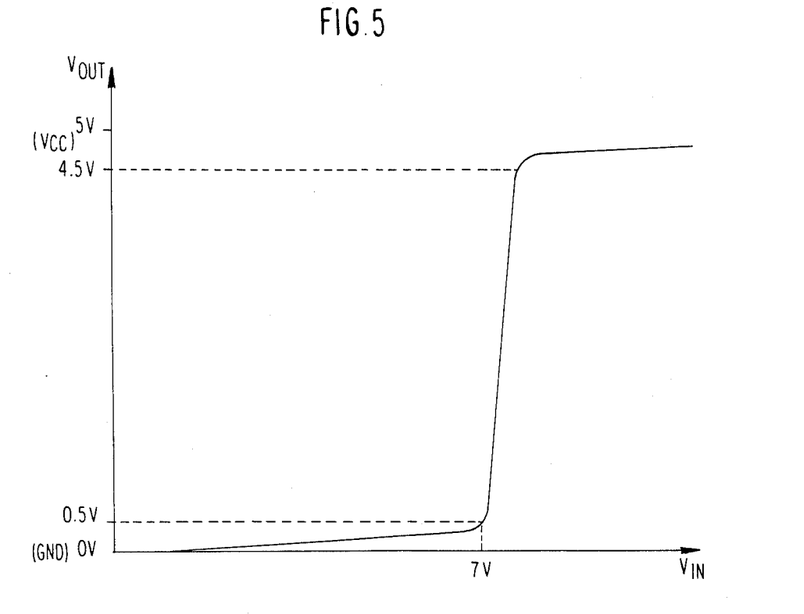
FIG. 5 is a graph representing a waveform of an output voltage $V_{OUT}$ with respect to an input voltage $V_{IN}$ in the circuit shown in FIG. 3.

The circuit shown in FIG. 3 is also utilized for detecting the aforementioned testing voltage. In this case, the second input terminal 11 is connected to the power supply terminal $V_{CC}$, and the ratio of the conductance of the transistors $Q_{14}$ to that of the transistor $Q_{18}$ is selected to be 1.5: 1. The ratios in conductances between the transistors $Q_{11}$ and $Q_{13}$, and $Q_{12}$ and $Q_{16}$, and $Q_{15}$ and $Q_{17}$ all are designed to be 1. According to these circuit designs, even when the input voltage $V_{IN}$ takes the power supply voltage $V_{CC}$, the current draw ability of the transistor $Q_{14}$ is larger than the current supply ability of the transistor $Q_{13}$, so that the output voltage is maintained at the low level, as shown in FIG. 5. When the input voltage $V_{IN}$ increases to 7 V, the output voltage $V_{OUT}$ starts to change its level. The output voltage $V_{OUT}$ is inverted quickly from the lower level to the high level, when the input voltage $V_{IN}$ exceeds 7 V. Accordingly, the testing voltage is detected. The level of the input voltage $V_{IN}$ at which the output voltage is inverted, 7 V, is stabilized against deviation from the designed threshold level of each transistor, as already mentioned.

The input voltage $V_{IN}$ and the reference voltage $V_{REF}$ can be supplied to the second terminal 11 and the first terminal 10, respectively. In this case, the output voltage $V_{OUT}$ is changed from the high level to the low level, when the input voltage $V_{IN}$ exceeds a predetermined detection level.

Figure 6:
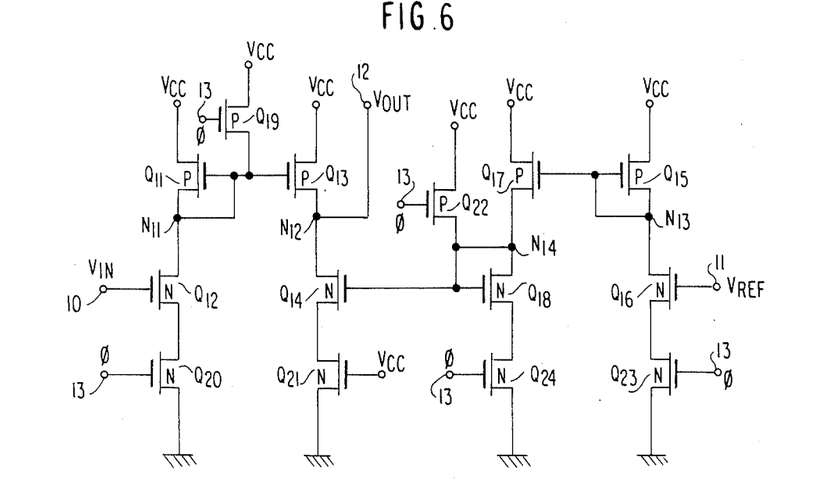
FIG. 6 is a circuit diagram showing another embodiment of the present invention.

FIG. 6 shows another embodiment of the present invention, in which the same constituents as those shown in FIG. 3 are denoted by the same reference numbers. This circuit further includes two P-channel MOS transistors $Q_{19}$ and $Q_{22}$, and four N-channel MOS transistors $Q_{20}$, $Q_{21}$, $Q_{23}$ and $Q_{24}$, and each of these transistors is of an enhancement type. The transistor $Q_{19}$ is connected between the power terminal $V_{CC}$ and the first node $N_{11}$, and the gate thereof is connected to a control terminal 13. The transistor $Q_{22}$ is connected between the power supply terminal $V_{CC}$ and the fourth node $N_{14}$, and the gate thereof is connected to the control terminal 13. The transistor $Q_{20}$ has its gate connected to the control terminal 13 and is inserted between the transistor $Q_{12}$ and the ground terminal. The transistor $Q_{21}$ is inserted between the transistor $Q_{14}$ and the ground terminal. The gate of the transistor $Q_{21}$ is supplied with the power voltage $V_{CC}$. The transistor $Q_{23}$ is inserted between the transistor $Q_{16}$ and the ground terminal and has its gate connected to the control terminal 13. The transistor $Q_{24}$ is connected between the transistor $Q_{18}$ and the ground terminal, and the gate of the transistor $Q_{24}$ is connected to the control terminal 13. The control terminal 13 is supplied with a control signal $\phi$.

The circuit shown in FIG. 6 is switched over between the stand-by mode and the activated mode by the control signal $\phi$. More specifically, when this circuit is brought into the stand-by mode, i.e., when the control signal $\phi$ takes the low level, the transistors $Q_{19}$ and $Q_{22}$ are turned ON, whereas the transistors $Q_{20}$, $Q_{23}$ and $Q_{24}$ are turned OFF. The transistors $Q_{11}$ and $Q_{13}$ are thereby brought into the nonconductive state. The transistor $Q_{14}$ is turned ON by the transistor $Q_{22}$, and the transistor $Q_{21}$ is in the conductive state. Accordingly, this circuit does not carry out the level detection operation, and the output voltage $V_{OUT}$ is held to the low level. Moreover, the transistors $Q_{20}$, $Q_{13}$, $Q_{23}$ and $Q_{24}$ are in the nonconductive state, and therefore no d.c. current path is formed between the power supply terminals $V_{CC}$ and GND, so that power dissipation in the stand-by mode is remarkably reduced.

When the control signal $\phi$ changes to the high level, the transistors $Q_{19}$ and $Q_{22}$ are turned OFF, and the transistors $Q_{20}$, $Q_{23}$ and $Q_{24}$ are turned ON. As a result, this circuit is in the activated state to carry out the level detection operation, similarly to the circuit shown in FIG. 3. It is preferable that the conductances of the transistors $Q_{20}$, $Q_{21}$, $Q_{23}$ and $Q_{24}$ are sufficiently high to neglect the insertion of these transistors.

The transistors $Q_{21}$ may be omitted, because it is maintained in the conductive state during the stand-by mode as well as the activated mode. However, in order to obtain the symmetry between a current path including the transistors $Q_{18}$ and $Q_{24}$ and that including the transistor $Q_{14}$, the transistor $Q_{21}$ is provided.

As already mentioned, the second input terminal may be connected to the power terminal $V_{CC}$. In this case, the detection output is produced when the input voltage $V_{IN}$ exceeds the power voltage $V_{CC}$, and therefore this circuit can be applied to a test circuit. This circuit is also applicable to a write circuit in an electrically programmable read only memory device (EPROM). The input voltage $V_{IN}$ and the reference $V_{REF}$ may be supplied to the second terminal 11 and the first terminal 10, respectively.

The present invention is not limited to the above-mentioned embodiments, but may be modified and changed without departing the scope and spirit of the invention. For example, the channel type of the respective transistors may be changed.

What is claimed is:

1. A transistor circuit comprising:
    first and second potential terminals;
    first and second input terminals;
    first, second, third, and fourth nodes;
    a first field effect transistor of a first conductivity type connected between said first potential terminal and said first node and having a gate connected to said first input terminal;
    a second field effect transistor of said first conductivity type connected between said first potential terminal and said second node and having a gate connected to said second input terminal;
    a third field effect transistor of a second, opposite conductivity type, connected between said second potential terminal and said first node and having a gate connected to said first node;
    a fourth field effect transistor of said second conductivity type connected between said second potential terminal and said third node and having a gate connected to the gate of said third transistor;
    a fifth field effect transistor of said second conductivity type connected between said second potential terminal and said second node and having a gate connected to said second node;
    a sixth field effect transistor of said second conductivity type connected between said second potential terminal and said fourth node and having a gate connected to the gate of said fifth transistor;

a seventh field effect transistor of said first conductivity type connected between said fourth node and said first potential terminal and having a gate connected to said fourth node;

an eighth field effect transistor of said first conductivity type connected between said third node and said first potential terminal and having a gate connected to the gate of said seventh transistor;

means for supplying an input voltage to one of said first and second input terminals;

means for supplying a reference voltage to the other of said first and second input terminals;

an output terminal coupled to said third node;

a ninth field transistor of said first conductivity type connected in series with said first field effect transistor between said first potential terminal and said first node;

a tenth field effect transistor of said first conductivity type connected in series with said second field effect transistor between said first potential terminal and said second node; and means for supplying a control signal to gates of said ninth and tenth field effect transistors, wherein said ninth and tenth field effect transistors are turned ON to enable said transistor circuit when said control signal takes a first logic level and turned OFF to disenable said transistor circuit when said control signal takes a second logic level.

2. A transistor circuit comprising first and second potential terminals, first, second, third, and fourth nodes, a first series connection circuit of first and second field effect transistors of a first conductivity type provided between said first potential terminal and said first node, a first input terminal connected to the gate of said first transistor, a second series connection circuit of third and fourth field effect transistors of said first conductivity type provided between said first potential terminal and said second node, a second input terminal connected to the gate of said third transistor, a fifth field effect transistor of a second, opposite conductivity type, connected between said second potential terminal and said first node and having a gate connected to said first node, a sixth field effect transistor of said second conductivity type connected between said second potential terminal and said third node and having a gate connected to the gate of said fifth transistor, a seventh field effect transistor of said second conductivity type connected between said second potential terminal and said second node and having a gate connected to said second node, an eighth field effect transistor of said second conductivity type connected between said second potential terminal and said fourth node and having a gate connected to the gate of said seventh transistor, a third series connection circuit of ninth and tenth field effect transistors of said first conductivity type provided between said third node and said first potential terminal, means for connecting the gate of said ninth transistor to said second potential terminal, a fourth series connection circuit of eleventh and twelfth field effect transistors of said first conductivity type provided between said fourth node and said first potential terminal, means for connecting the gate of said eleventh transistor to said fourth node and to the gate of said tenth transistor, an output terminal connected to said third node, a control terminal connected in common to the gates of said second, fourth and twelfth transistors, means for supplying an input voltage to one of said first and second input terminals, means for supplying a reference voltage to the other of said first and second input terminals, and means for supplying a control signal to said control terminal, said second, fourth, and twelfth transistors being turned on to enable said first, third, and eleventh transistors respectively when said control signal is at a first level, and being turned off to disenable said first, third, and eleventh transistors respectively when the control signal is at a second level.

3. The circuit as claimed in claim 2, further comprising a thirteenth field effect transistor of said second conductivity type connected between said first node and said second potential terminal and fourteenth field effect transistor of said second conductivity type connected between said fourth node and said second potential terminal, said control terminal being further connected to the gates of said thirteenth and fourteenth transistors.

4. A comparator comprising:
an input terminal receiving an input voltage;
a reference terminal receiving a reference voltage;
a first terminal receiving a first power voltage;
a second terminal receiving a second power voltage smaller than said first power voltage;
an output terminal;
first and second nodes;
a first P-channel field effect transistor connected between said first power terminal and said output terminal;
a second P-channel field effect transistor connected between said first power terminal and said first node and having a gate connected to said first node and to a gate of said first field effect transistor;
first converting means coupled to said input terminal for converting said input voltage into a first current;
means for supplying said first current to said first node;
a third N-channel field effect transistor connected between said second power terminal and said output terminal;
a fourth N-channel field effect transistor connected between said second power terminal and said second node and having a gate connected to said second node and to a gate of said third field effect transistor;
second converting means coupled to said reference terminal for converting said reference voltage into a second current; and
means for supplying said second current to said second node, said first and second field effect transistors constituting a first current mirror circuit, said third and fourth field effect transistors constituting a second current mirror circuit, wherein an output voltage of said output terminal is changed from a first level close to one of said first and second power voltages to a second level close to the other of said first and second power voltages when said input voltage exceeds said reference voltage.

5. A detection circuit for detecting whether an input voltage is larger than a positive power supply voltage, comprising:
a first input terminal supplied with said input voltage;
a first power terminal supplied with said positive power supply voltage;
a second power terminal supplied with a ground potential;

a second input terminal connected to said first power terminal;

first, second and third nodes;

an output terminal;

a first N-channel field effect transistor connected between said second power supply terminal and said first node and having a gate connected to said first input terminal;

a second P-channel field effect transistor connected between said first power terminal and said first node and having a gate connected to said first node;

a third P-channel field effect transistor connected between said first power terminal and said output terminal and having a gate connected to the gate of said second field effect transistor;

a fourth N-channel field effect transistor connected between said second power terminal and said second node and having a gate connected to said second input terminal;

a fifth P-channel field effect transistor connected between said first power terminal and said second node and having a gate connected to said second node;

a sixth P-channel field effect transistor connected between said first power terminal and said third node and having a gate connected to the gate of said fifth field effect transistor;

a seventh N-channel field effect transistor connected between said second power terminal and said third node and having a gate connected to said third node; and an eighth N-channel field effect transistor connected between said second power terminal and said output terminal and having a gate connected to the gate of said seventh field effect transistor, wherein said circuit produces a detection output from said output terminal when said input voltage is larger than said positive power supply voltage by a predetermined value.

* * * * *

UNITED STATES PATENT AND TRADEMARK OFFICE
CERTIFICATE OF CORRECTION

PATENT NO. : 4,749,880

DATED : June 7, 1988

INVENTOR(S) : Kobatake

It is certified that error appears in the above-identified patent and that said Letters Patent is hereby corrected as shown below:

COLUMN 2, LINE 15  Delete "is" and insert --in--.

Signed and Sealed this

First Day of November, 1988

Attest:

DONALD J. QUIGG

*Attesting Officer*  *Commissioner of Patents and Trademarks*